PHOTOCELL WITH COOLING MEANS AND METHOD OF USING SAME

Filed July 2, 1963 2 Sheets-Sheet 1

INVENTOR.
ROBERT E. SALOMON
BY

PHOTOCELL WITH COOLING MEANS AND METHOD OF USING SAME

Filed July 2, 1963 2 Sheets-Sheet 2

INVENTOR.
ROBERT E. SALOMON
BY
Roland A. Anderson
Attorney 3,274,030
Patented Sept. 20, 1966

3,274,030

PHOTOCELL WITH COOLING MEANS AND METHOD OF USING SAME

Robert E. Salomon, North Hills, Glenside, Pa., assignor to the United States of America as represented by the United States Atomic Energy Commission Filed July 2, 1963, Ser. No. 292,798
10 Claims. (Cl. 136—89)

The invention described herein was made in the course of, or under, a contract with the U.S. Atomic Energy Commission.

This invention relates to photovoltaic output devices and means for increasing the photovoltaic output from such devices.

Photocells have been useful as electrical photovoltaic power generators and linear optical converters but generally such devices have produced small photovoltaic outputs. It has been universally recognized, therefore, that it would be advantageous to increase the photovoltaic output of these devices and to provide high photovoltaic output devices.

It has been discovered in accordance with this invention that increased photovoltaic outputs can be produced by cooling photocells to low temperatures.

It is an object of this invention, therefore, to provide high photovoltaic output devices;

It is another object of this invention, to provide photovoltaic output devices whose photovoltaic outputs are increased at low temperatures;

It is another object of this invention to provide a method for increasing photocell photovoltaic outputs.

According to this invention a photocell having a base electrode, a semi-conductor surface on said base electrode and a metallic coating on this surface is cooled in a vacuum in the presence of ultra-violet light to increase its photovoltaic output. The photocell of this invention, comprises a zirconium or niobium base electrode, an anodized surface on this base, and a metal coating on the anodized surface.

Various other objects and advantages will appear from the following description of embodiments of this invention, and the novel features will be particularly pointed out hereinafter in connection with the appended claims.

Figure 2:
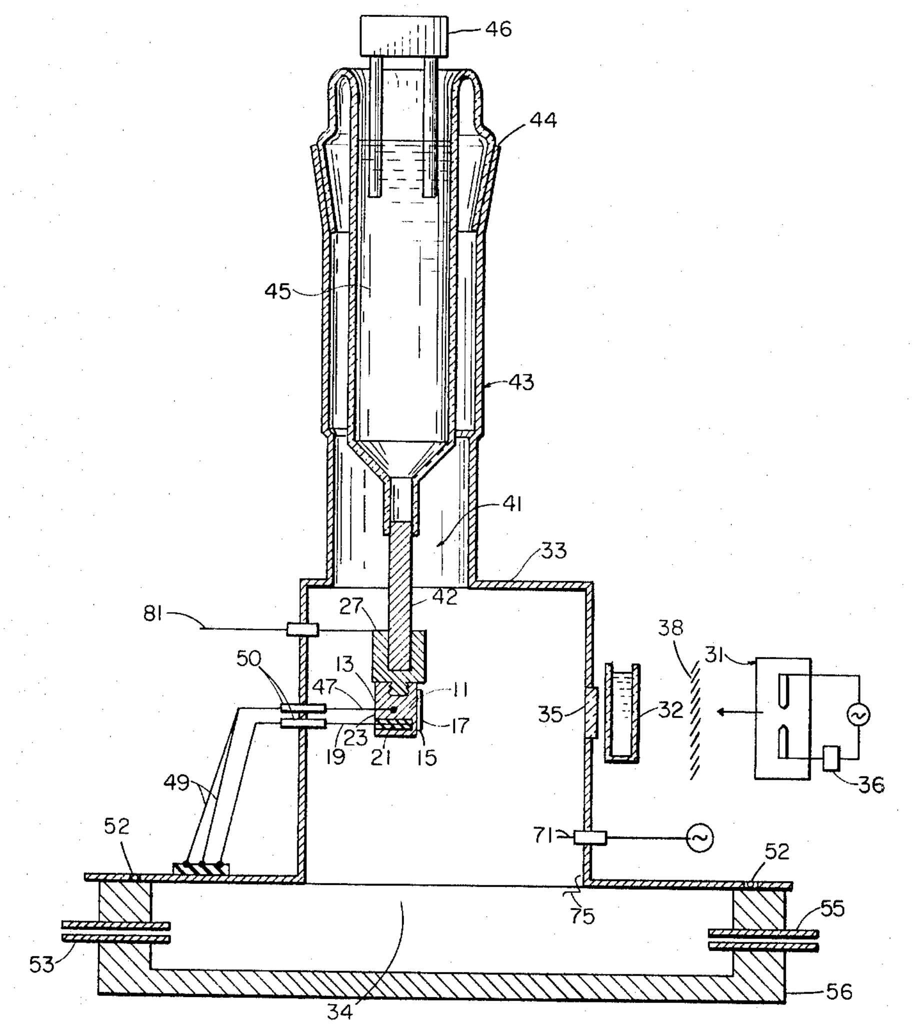
FIG. 2 is a partial reduced view of the photocell of FIG. 1 having cooling means according to this invention.
Figure 1:
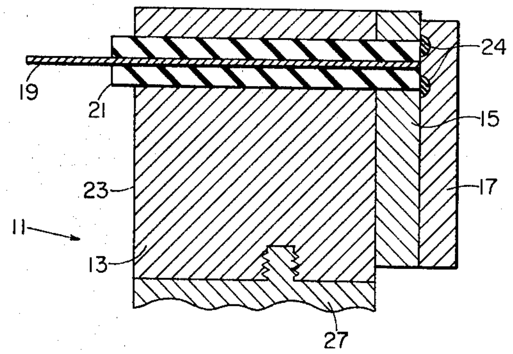
FIG. 1 is an enlarged partial cross-section of the photocell of this invention.

Referring to FIG. 1, photocell 11 is useful as an electrical power generator and a linear optical converter. This photocell comprises a base electrode 13 having a semi-conductor surface 15 on the base and a metal coating 17 on the semi-conductor surface.

Advantageously the base electrode is relatively thick and contains a lead such as a platinum wire 19 which passes through a ceramic insulator 21 from the semi-conductor free surface 23 to the metal coating 17. An epoxy cement 24 holds the insulator 21 and wire lead 19 to this metal coating 17. A second lead may be connected directly to the zirconium and to this end copper conductor 27 may be fitted into the zirconium base 13 and have an appropriate lead therefrom. By connecting this lead from the conductor 27 and lead 19 in a circuit through a voltmeter (not shown) the photovoltaic output from photocell 11 can be determined when light from a source 31 is shined on the coating 17. This output is advantageously determined by a millivoltmeter with an auxiliary circuit connected between conductor 27 and lead 19.

Actuation source 31 is an ultra-violet light source since the primary sensitivity of this described cell 11 is in the ultra-violet wave length region, with or without water filter 32, and since no potential was observed with a glass or acetic acid (2500 A.) filter. This source, advantageously shines against metal coating surface 17 in a container 33 forming an evacuated chamber 34 having a quartz window 35 which passes this ultra-violet light. A suitable source 31 has been a mercury-xenon lamp whose intensities have been controlled by a suitable variac 36. This light intensity on photocell 11 has been selectively cut on and off by shutter 38 and measured by reflecting a portion of the light with an aluminum mirror onto a photocell such as a search unit of a photovolt photometer. At a fixed wave length, the short circuit photocurrent of photocell 11 varies substantially linearly with source intensity (at any temperature). It is noted, however, that the open circuit photovoltage is more sensitive to light intensity at low temperature.

Photocell 11 is advantageously cooled to low temperatures to increase the voltage output therefrom. To this end the electrode 13 has a heat conducting mount 41, comprising copper conductor 27 and brass rod 42 which is disposed between this conductor 27 and the bottom of Dewar 43 where the brass rod is exposed to a coolant 45 therein and sealed against coolant leakage therefrom with Koval metal to glass sealing material. The Dewar is advantageously demountable and has a suitable friction seal 44 on the top of the container 33 that prevents air leakage into the vacuum in chamber 34. Dewar 43 is filled with a liquid coolant 45 from a suitable coolant circulating means 46. Also, a copper constantan thermocouple 47 has suitable leads 49 passing from electrode 13 through a suitable insulator 50 in the side of the container 33. The leads 49 then connect with a suitable potentiometer calibrated to indicate the temperature of photocell 11.

Suitable neoprene O-rings 52 maintain a seal between the top and bottom of container 33 when the container 33 is closed and evacuated. Ducts 53 and 55 pump air out of chamber 34 to a vacuum of about $10^{-3}$ to $10^{-6}$ mm. of Hg. This pumping controls the contaminants which might otherwise come in contact with photocell 11. Also, zirconium foil 71, mounted on the inside of vacuum chamber 34, is electrically heated to redness to act as an oxygen getter. Additionally, suitable means are provided for circulating gases into chamber 34 through ducts 53 and 55 at various pressures and temperatures.

In producing the above-described photocell 11, the base electrode bars, e.g. zirconium bars, of high commercial purity were initially drilled with a hole through each bar perpendicular to the face. Care was taken to prevent excessive heating. A ceramic tube with an inner diameter of the order of B&S gauge #18 was then fitted with a platinum wire of that diameter and the whole assembly was placed within the drilled hole, using epoxy cement to ensure rigidity. The whole assembly was then held at 120° C. for ten minutes to cure the epoxy cement.

One face of this assembly was mechanically abraded with emery papers of grades 1, 2/0 and 4/0, respectively, and then wet polished on a jeweler's wheel to a micropolish finish. This was followed by etching in a $HF—HNO_3$ bath and then washing in distilled water. The samples were then anodized at room temperature (25–30° C.) to various oxide thickness in a sodium borate-boric acid solution at pH 8. The formation of polarization voltage (e.g. 75 or 100 volts), was maintained for ten or more hours. The anodic oxide films exhibited typical interference colors.

Upon removal from the anodization solution, the samples were washed with distilled water, ethyl alcohol, isopropyl alcohol and then dried at room temperature. A coating of epoxy cement was then placed around the ceramic, care being taken not to cover the platinum wire. This was done in order to eliminate edge effects at the boundary between the oxide and the hole.

Thin semi-transparent layers of different respective metal coatings 17 were deposited on the oxide film 15 by vacuum deposition from a W basket 75 inside evacuated chamber 34. To this end, an evaporator is advantageously used to form the bottom 56 of container 33. The evaporation was performed perpendicular to the electrode 13 or at an angle and still the described high photovoltages and voltage increases were obtained. Care was taken to eliminate edge effects by suitable masking.

The photocells 11, prepared as described above, all exhibited a short circuit photogalvanic effect, i.e. the production of a photocurrent without the application of an external field. Additionally, the photocurrents were about $10^{-9}$ amps/cm.$^2$ at room temperature.

In operation, source 31 shines ultra-violet light through quartz window 35 which transmits the light across vacuum chamber 34 to metal coating 17. Copper conductor 27 conducts heat from photocell 11 through brass rod 42 to liquid coolant 45 in Dewar 43. This cools photocell 11 to a temperature, as indicated by means of thermocouple 47, to produce a high or increased photovoltaic output from photocell 11. The pumping of gas through ducts 53 and/or 55 maintains a low pressure in chamber 34. The temperature of photocell 11 is controlled to a constant temperature by adjusting the flow of liquid coolant 45 in Dewar 43 and/or the flow of gas in chamber 34.

By attaching a suitable voltmeter between lead 19 and lead 81, which is connected to conductor 27 and passes through a suitable insulator in the wall of container 33, the voltage output of photocell 11 is determined. This output varies with the wave length of source 31 so that the wave length of the light from this source may be determined. The spectral sensitivity of the short circuit photocurrent, however, corresponds to the oxide absorption spectrum. Also, since the output voltage is so high from photocell 11, a load may be substituted for the voltmeter and then charged by photocell 11 for useful work.

Whereas the zirconium based photocells 11 developed photopotentials of only up to about 1.5 volts between 25° C. and −100° C., these same photocells produced increased voltages at lower temperatures, and at least 25 volts between −145° C. and −175° C. These high voltages outputs are illustrated, for example by the following table of actual voltages produced by the described apparatus:

*Table I.—Zirconium electrodes anodized at 30° C.*

| Electrode | Polarization Voltage, v. | Metal Coating | T° C. | Light Intensity | Maximum Photovoltage, v. |
|---|---|---|---|---|---|
| 1 | 75 | Cu | 25 | 360 | 1.6 |
| 1 | 75 | Cu | −175 | 360 | 35 |
| 1 | 75 | Cu | −64 | 360 | 0.8 |
| 1 | 75 | Cu | −170 | 360 | 0.0 |
| | | | | (Acetic acid filter) | |
| 2 | 100 | Cu | 25 | 360 | 1.6 |
| 2 | 100 | Cu | −170 | 360 | 35 |
| 2 | 100 | Cu | −64 | 360 | 1.2 |
| 3* | 75 | Au | 25 | 360 | 1.35 |
| 3* | 75 | Au | −174 | 360 | 35 |
| 3* | 75 | Au | −39 | 360 | 1.0 |
| 4 | 100 | Sn | 26 | 380 | 1.6 |
| 4 | 100 | Sn | −162 | 40 | 70 |
| 4 | 100 | Sn | −162 | 350 | 90 |
| 5* | 100 | Sn | −48 | 360 | 7.4 |
| 5* | 100 | Sn | −130 | 360 | 18 |
| 5* | 100 | Sn | −145 | 360 | 44 |
| 6 | 100 | Bi | 25.5 | 360 | 1.3 |
| 6 | 100 | Bi | −159 | 360 | 40 |
| 6 | 100 | Bi | −161 | 40 | 12 |
| 6 | 100 | Bi | 25 | 40 | 1 |
| 6 | 100 | Bi | 25 | 160 | 1.3 |
| 6 | 100 | Bi | 35 | 360 | 1.3 |
| 7* | 100 | Fe | 25 | 360 | 1.35 |
| 7* | 100 | Fe | −187 | 360 | 25 |
| 8 | 100 | Pb | 25 | 360 | 1.22 |

*Numbers with asterisk indicate that the metal was evaporated directly.

Although the examples of this invention have been illustrated with regard to particular metal coatings 17 on an anodized zirconium photocell 11, other metal coatings 17 employed therewith provide increased voltages at low temperatures in the presence of ultra-violet light. Such coatings 17, for example, are aluminum, silver and lead. Increased voltages have also been produced at low temperatures with photocells 11 having a niobium base 13, anodized surface 15 and metal coating 17 comprising the abovementioned metal coatings 17. In one test with light from source 31, for example, the output of a $Nb/Nb_2O_5$ (anodized at 100 volts)/Cu photocell 11 in evacuated chamber 33 has been doubled from room temperature to below −100° C., and has been increased to 3.8 volts at −134° C. and 14.6 volts at −193° C. It has also been found that all these photocells exhibited the short circuit photogalvanic effect described above. Additionally these photocells 11 produced photocurrents of about $10^{-9}$ to $10^{-10}$ amps/cm.$^2$.

Figure 3:
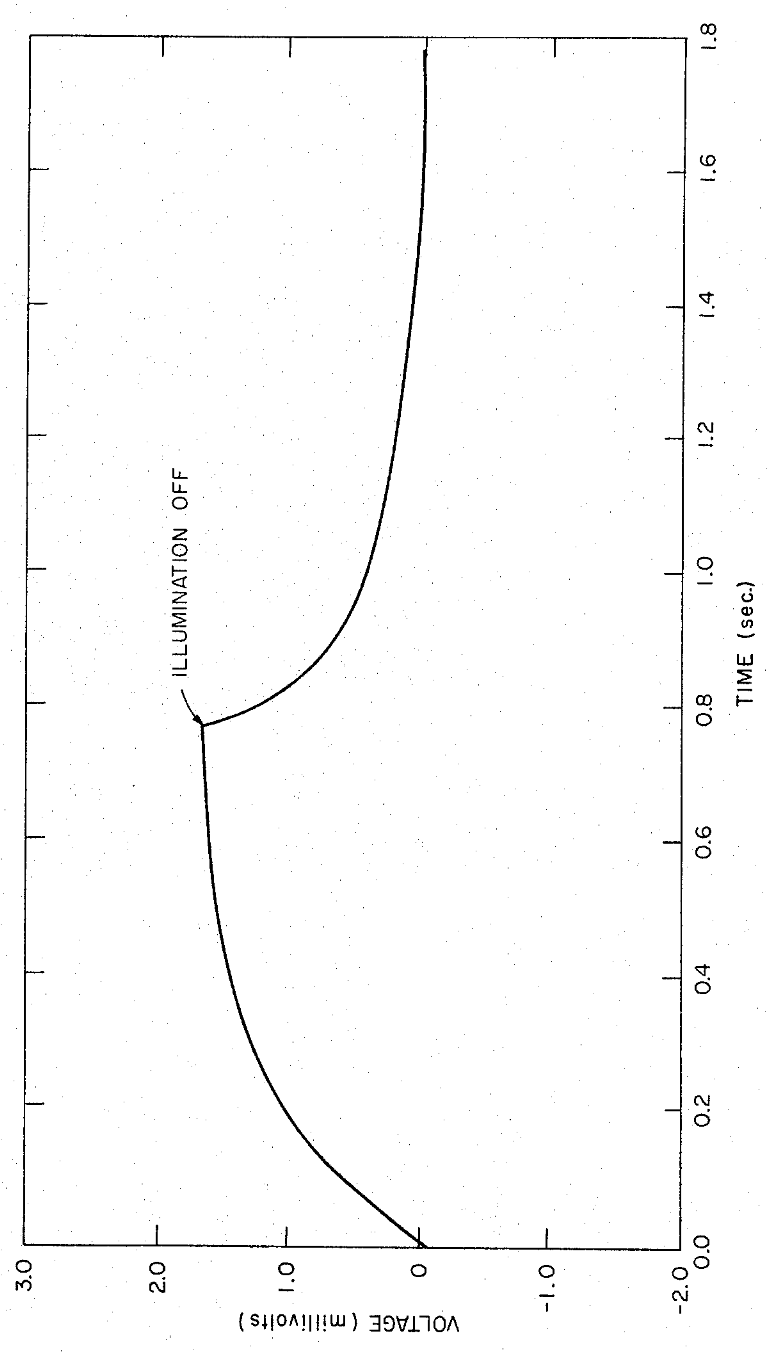
FIG. 3 is a graph of the photocurrent output from a $Zr/ZrO_2$ (100 volt)/Ag photocell, exposed to an ultraviolet light source at room temperature.

Both the open circuit photovoltage and short circuit photocurrent of photocell 11 exhibit a rise and decay of the type shown in FIG. 3 which refers to a short circuit photocurrent of a $Zr/ZrO_2$ (100 volts polarization voltage)/Ag photocell 11. In this test a $10^5$ ohm resistor essentially shorted the photocell. However, the open circuit photovoltage response and decay is of the order of 100 times slower. The meter used in the open circuit photovoltage measurements had an impedance of $10^{14}$ ohms.

The effect of this invention in increasing photocell output voltages by cooling the photocells is not limited to any particular crystal face, oxide film thickness or evaporated metal layer. Also, electrodes with various oxide film thickness, corresponding to anodization voltages of 20, 40, 50, 60, 75, 80 and 100 volts, were used in producing this effect.

This invention provides increased photovoltaic outputs in a simple, inexpensive, and useful manner. Actual tests, for example, have shown that this invention provides increased outputs by cooling the photocells and in one example this output was increased from 1.5 volts at room temperature to 90 volts at −162° C.

What is claimed is:

1. A photoelectric device which provides a high photovoltaic output in the presence of ultra-violet light, comprising
   (a) a metal base electrode selected from the group consisting of zirconium and niobium,
   (b) an oxide coating of said base electrode on at least one surface thereof,
   (c) a thin metallic coating on said oxide coating,
   (d) means for cooling said base electrode to a temperature no greater than about −130° C., and
   (e) said device constructed for exposure to ultra-violet light.

2. The photoelectric device of claim 1 wherein said base electrode is zirconium and said metallic coating is selected from the group consisting of copper, gold, iron, tin and bismuth.

3. The photoelectric device of claim 1 wherein said base electrode is niobium and said metallic coating is copper.

4. The method of increasing the photovoltaic output of a photocell having a metal base electrode selected from the group consisting of zirconium and niobium, an oxide coating of said base electrode on at least one surface thereof, a thin metallic coating on said oxide coating, comprising exposing said photocell to ultra-violet light and cooling said photocell to a temperature no greater than about −130° C.

5. The method of claim 4 wherein said base electrode is zirconium and said metallic coating is copper and said photocell is cooled to a temperature no greater than about −175° C.

6. The method of claim 4 wherein said base electrode is zirconium and said metallic coating is gold and said photocell is cooled to a temperature no greater than about −174° C.

7. The method of claim 4 wherein said base electrode is zirconium and said metallic coating is iron and said photocell is cooled to a temperature no greater than about −187° C.

8. The method of claim 4 wherein said base electrode is zirconium and said metallic coating is tin and said photocell is cooled to a temperature no greater than about −162° C.

9. The method of claim 4 wherein said base electrode is zirconium and said metallic coating is bismuth and said photocell is cooled to a temperature no greater than about −159° C.

10. The method of claim 4 wherein said base electrode is niobium and said metallic coating is copper and said photocell is cooled to a temperature no greater than about −193° C.

References Cited by the Applicant

UNITED STATES PATENTS 2,993,266 7/1961 Berry.

WINSTON A. DOUGLAS, *Primary Examiner.*

A. B. CURTIS, *Assistant Examiner.*